United States Patent
Chen et al.

(10) Patent No.: US 10,134,868 B2
(45) Date of Patent: Nov. 20, 2018

(54) MOS DEVICES WITH MASK LAYERS AND METHODS FOR FORMING THE SAME

(71) Applicant: Taiwan Semiconductor Manufacturing Company, Ltd., Hsinchu (TW)

(72) Inventors: Chu-Fu Chen, Zhubei (TW); Chia-Chung Chen, Keelung (TW); Chi-Feng Huang, Zhubei (TW); Victor Chiang Liang, Hsinchu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/942,663

(22) Filed: Apr. 2, 2018

(65) Prior Publication Data

US 2018/0226488 A1    Aug. 9, 2018

Related U.S. Application Data

(60) Continuation of application No. 14/861,802, filed on Sep. 22, 2015, now Pat. No. 9,947,762, which is a
(Continued)

(51) Int. Cl.
| | |
|---|---|
| *H01L 21/283* | (2006.01) |
| *H01L 29/66* | (2006.01) |
| *H01L 21/768* | (2006.01) |
| *H01L 29/78* | (2006.01) |
| *H01L 21/285* | (2006.01) |

(52) U.S. Cl.
CPC .. *H01L 29/66492* (2013.01); *H01L 21/76897* (2013.01); *H01L 29/6656* (2013.01); *H01L 29/66659* (2013.01); *H01L 29/7835* (2013.01); *H01L 21/28518* (2013.01)

(58) Field of Classification Search
CPC ......... H01L 29/66492; H01L 21/76897; H01L 29/6656; H01L 29/66659; H01L 21/28518; H01L 29/78; H01L 21/336
See application file for complete search history.

(56) References Cited

U.S. PATENT DOCUMENTS

| | | | |
|---|---|---|---|
| 6,100,125 A | 8/2000 | Hulfachor et al. | |
| 6,319,784 B1 | 11/2001 | Yu et al. | |

(Continued)

FOREIGN PATENT DOCUMENTS

| | | |
|---|---|---|
| KR | 20040025948 A | 3/2004 |
| KR | 100752194 B1 | 8/2007 |
| TW | 201130085 A | 9/2011 |

*Primary Examiner* — Asok K Sarkar
*Assistant Examiner* — Dmitriy Yemelyanov
(74) *Attorney, Agent, or Firm* — Slater Matsil, LLP

(57) ABSTRACT

A device includes a substrate, a gate dielectric over the substrate, and a gate electrode over the gate dielectric. A drain region and a source region are disposed on opposite sides of the gate electrode. Insulation regions are disposed in the substrate, wherein edges of the insulation regions are in contact with edges of the drain region and the source region. A dielectric mask includes a portion overlapping a first interface between the drain region and an adjoining portion of the insulation regions. A drain silicide region is disposed over the drain region, wherein an edge of the silicide region is substantially aligned to an edge of the first portion of the dielectric mask.

19 Claims, 12 Drawing Sheets

Related U.S. Application Data division of application No. 13/471,270, filed on May 14, 2012, now Pat. No. 9,159,802.

(56) References Cited

U.S. PATENT DOCUMENTS

| | | |
|---|---|---|
| 7,521,741 B2 | 4/2009 | Jong et al. |
| 7,888,734 B2 | 2/2011 | Chu et al. |
| 7,977,743 B2 | 7/2011 | Chu et al. |
| 8,350,327 B2 | 1/2013 | Chung et al. |
| 2002/0056879 A1 | 5/2002 | Wieczorek et al. |
| 2004/0217428 A1 | 11/2004 | Choi et al. |
| 2005/0064721 A1* | 3/2005 | Tsai .................. H01L 21/31105 438/740 |
| 2006/0145270 A1 | 7/2006 | Choi |
| 2007/0023822 A1 | 2/2007 | Sung et al. |
| 2007/0063349 A1 | 3/2007 | Kao et al. |
| 2008/0093675 A1 | 4/2008 | Yao et al. |
| 2010/0052057 A1 | 3/2010 | Chung et al. |
| 2010/0279459 A1 | 11/2010 | Huang et al. |
| 2011/0068411 A1 | 3/2011 | Sun et al. |
| 2011/0147844 A1 | 6/2011 | Smith |

* cited by examiner

US 10,134,868 B2

MOS DEVICES WITH MASK LAYERS AND METHODS FOR FORMING THE SAME

This application is a continuation of U.S. patent application Ser. No. 14/861,802, filed on Sep. 22, 2015, entitled "MOS Devices with Mask Layers and Methods for Forming the Same," which is a divisional of U.S. patent application Ser. No. 13/471,270, filed on May 14, 2012, entitled "MOS Devices with Mask Layers and Methods for Forming the Same," now U.S. Pat. No. 9,159,802, each application is hereby incorporated herein by reference in its entirety.

BACKGROUND

The semiconductor Integrated Circuit (IC) industry has experienced rapid growth. Technological advances in IC materials and design have produced generations of ICs, with each generation having smaller and more complex circuits than the previous generations. These advances, however, have caused the increase in the complexity of processing and manufacturing ICs and, for these advances to be realized, similar developments in IC processing and manufacturing are needed.

As semiconductor circuits composed of devices such as Metal-Oxide-Semiconductor Field-Effect Transistors (MOSFETs) are adapted for high voltage applications, problems arise with respect to incorporating a high voltage device with a low voltage device (e.g., a logic device) for a System on Chip (SoC) technology. For example, as the scaling down of logic device continues, the process flow may be accompanied with high implantation concentrations, and thus may cause high leakage problems and the degradation of the device reliability.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A Metal-Oxide-Semiconductor Field-Effect Transistors (MOSFET) with reduced leakage current and the method of forming the same are provided in accordance with various exemplary embodiments. The intermediate stages of forming the MOSFET are illustrated in accordance with an exemplary embodiment. The variations of the embodiment are discussed. Throughout the various views and illustrative embodiments, like reference numbers are used to designate like elements.

Figure 1:
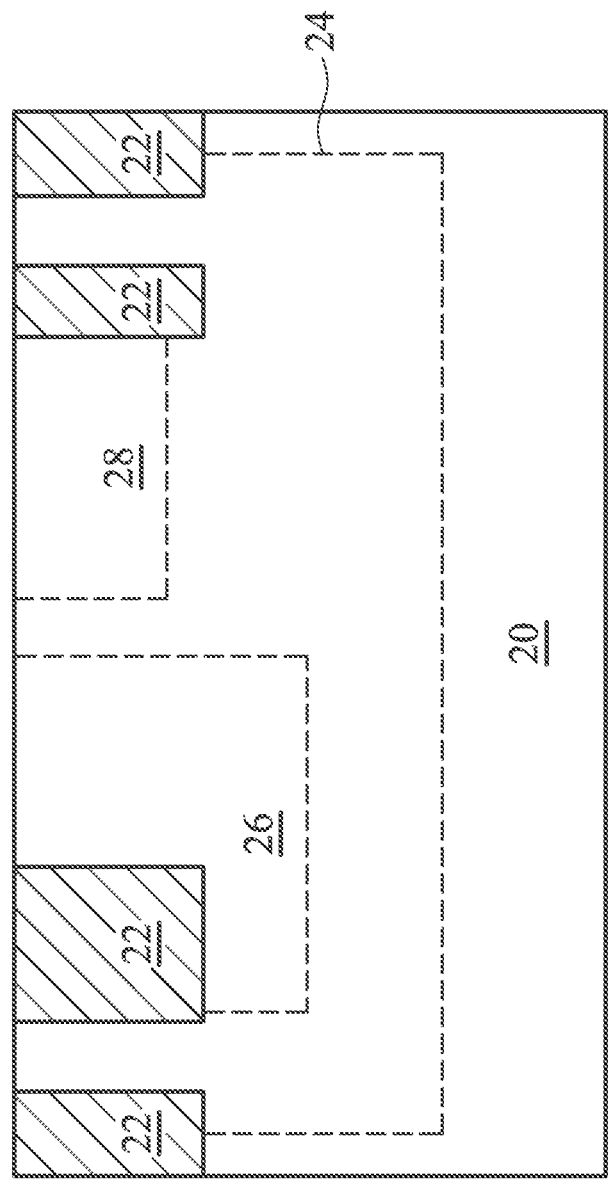
FIGS. 1 through 8 are top views and cross-sectional views of intermediate stages in the manufacturing of a Metal-Oxide-Semiconductor Field-Effect Transistors (MOSFET) in accordance with some exemplary embodiments.

FIGS. 1 through 8 are cross-sectional views and top views of intermediate stages in the manufacturing of MOSFET 100 (FIG. 8) in accordance with exemplary embodiments. Referring to FIG. 1, substrate 20 is provided, wherein substrate 20 may be a portion of a semiconductor wafer such as a silicon wafer. Alternatively, substrate 20 may include other semiconductor materials such as germanium. Substrate 20 may also include a compound semiconductor such as silicon carbon, gallium arsenic, indium arsenide, indium phosphide, III-V compound semiconductor materials, or the like. Substrate 20 may be a bulk semiconductor substrate, and an epitaxial layer may be, or may not be, formed on the bulk substrate. Furthermore, substrate 20 may be a Semiconductor-On-Insulator (SOI) substrate. In some embodiments, Deep N-Well (DNW) 24 may be formed in substrate 20, for example, through implantation.

Insulation regions 22 are formed in substrate 20 to define and electrically isolate active regions, in which devices such as transistors may be formed. Insulation regions 22 may be Shallow Trench Isolation (STI) regions or Local Oxidation of Silicon (LOCOS) regions.

FIG. 1 further illustrates the formation of n-well region 26 and p-well region 28. In some embodiments, the formation of each of n-well 26 and p-well region 28 includes forming and patterning a photo resist (not shown), wherein the regions of substrate 20 in which n-well 26 and p-well region 28 are to be formed are exposed. An implantation is then performed to form n-well 26 or p-well region 28. The respective photo resist is then removed. In some exemplary embodiments, n-well 26 and p-well region 28 may have impurity concentrations between about $10^{14}/cm^3$ and about $10^{17}/cm^3$. It is appreciated, however, that the values recited throughout the description are merely examples, and may be changed to different values.

Figure 2:
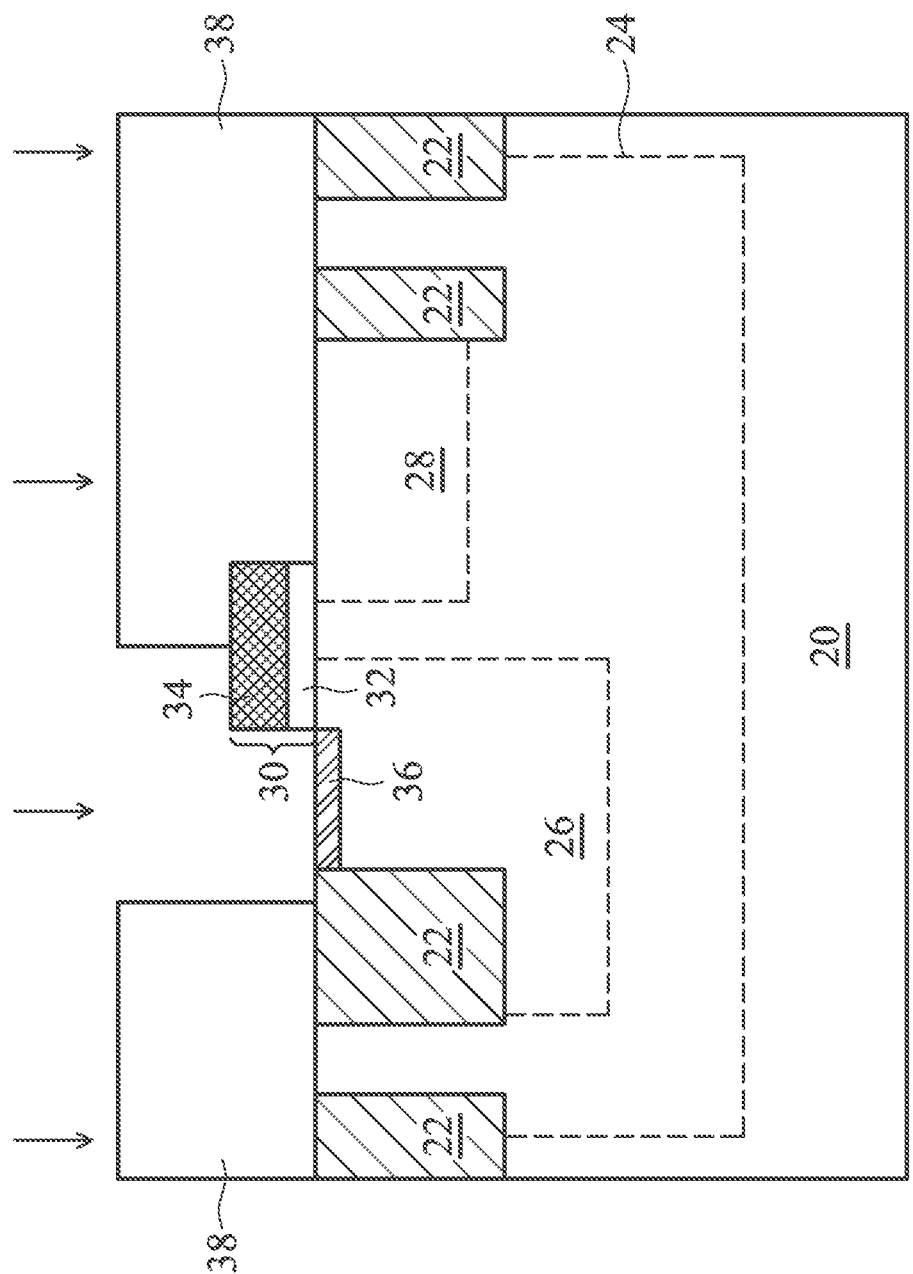

Referring to FIG. 2, gate structure 30 is formed over substrate 20. In some embodiments, gate structure 30 includes a first portion overlying n-well region 26 and a second portion overlying p-well region 28. Gate structure 30 includes gate dielectric 32, and gate electrode 34 overlying gate dielectric 32. In some exemplary embodiments, gate dielectric 32 comprises silicon dioxide. Alternatively, gate dielectric 32 may comprise a high-k dielectric material, silicon oxynitride, other suitable materials, or combinations thereof. The high-k material may be selected from metal oxides, metal nitrides, metal silicates, transition metal-oxides, transition metal-nitrides, transition metal-silicates, oxynitrides of metals, metal aluminates, zirconium silicate, zirconium aluminate, hafnium oxide, or combinations thereof. Gate dielectric 32 may be formed using Chemical Vapor Deposition (CVD), Atomic Layer Deposition (ALD), thermal oxide, and the like.

Gate electrode 34 may comprise polycrystalline silicon (polysilicon). Alternatively, gate electrode 34 comprises a metal or a metal silicide such as Al, Cu, W, Ni, Mo, Co, Ti, Ta, TiN, TaN, NiSi, NiPtSi, CoSi, or combinations thereof. The formation methods of gate electrode 34 include CVD, Physical Vapor Deposition (PVD), ALD, and other proper processes. The formation of gate dielectric 32 and gate electrode 34 may include forming a blanket dielectric layer and a blanket gate electrode layer, and then performing a patterning to form gate dielectric 32 and gate electrode 34.

Referring to FIG. 2, p-type source extension region 36 is formed. The formation process may include forming and patterning photo resist 38, wherein portions of n-well region 26 on the source side of gate structure 30 is exposed. An implantation is then performed to form p-type source extension region 36, which has an edge substantially self-aligned to an edge of gate structure 30. Source extension region 36 may have a p-type impurity concentration between about $10^{15}/cm^3$ and about $10^{14}/cm^3$, for example. Photo resist 38 is then removed.

Figure 3:
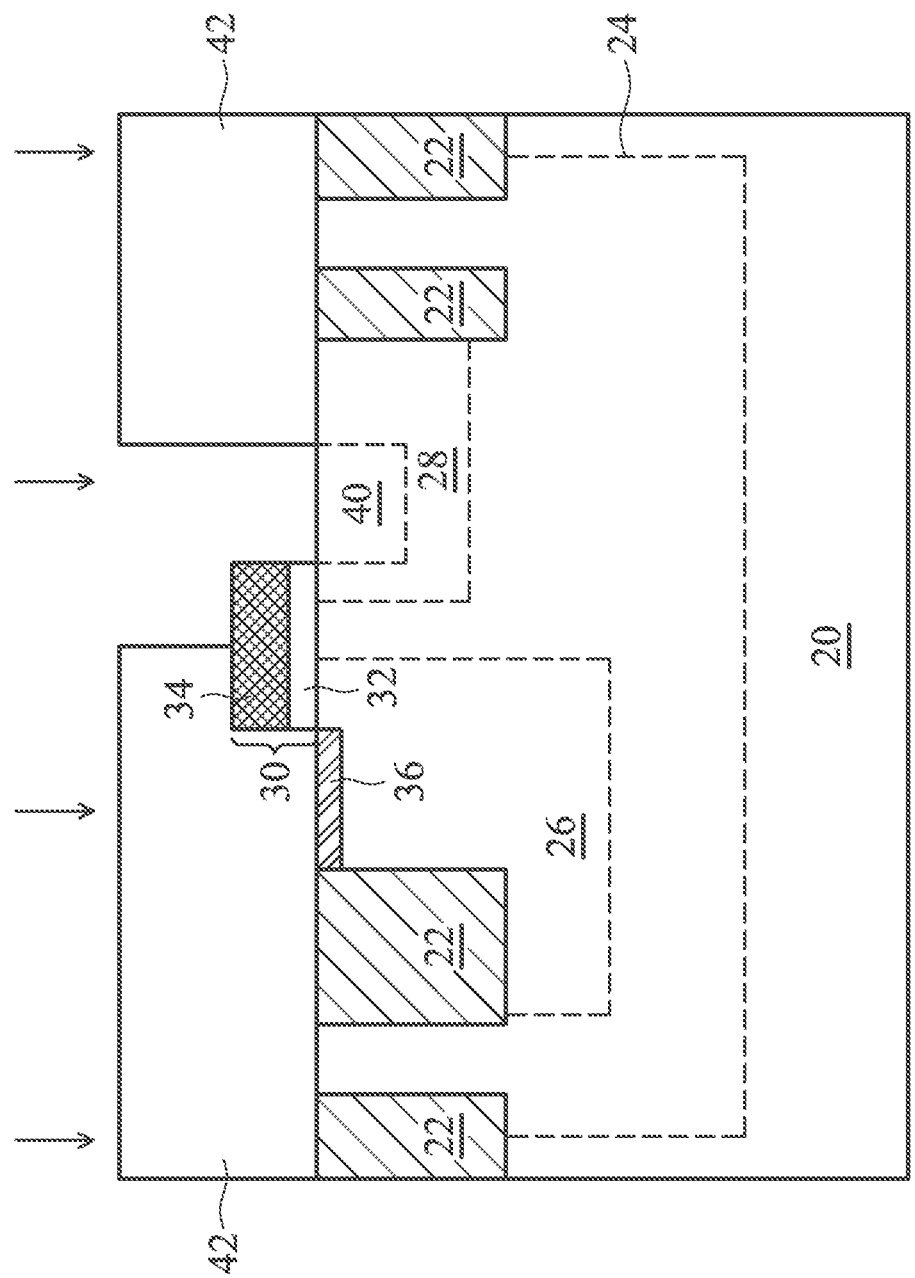

FIG. 3 illustrates the formation of n-type Lightly Doped Drain (nLDD) region 40. The formation process may include forming and patterning photo resist 42, wherein a portion of p-well region 28 on the drain side of gate structure 30 is exposed. An implantation is then performed to form nLDD region 40, which has an edge substantially self-aligned to an edge of gate structure 30. NLDD region 40 may have an n-type impurity concentration between about $10^{11}/cm^3$ and about $10^{13}/cm^3$, for example. After the formation of nLDD region 40, photo resist 42 is removed.

Figure 4:
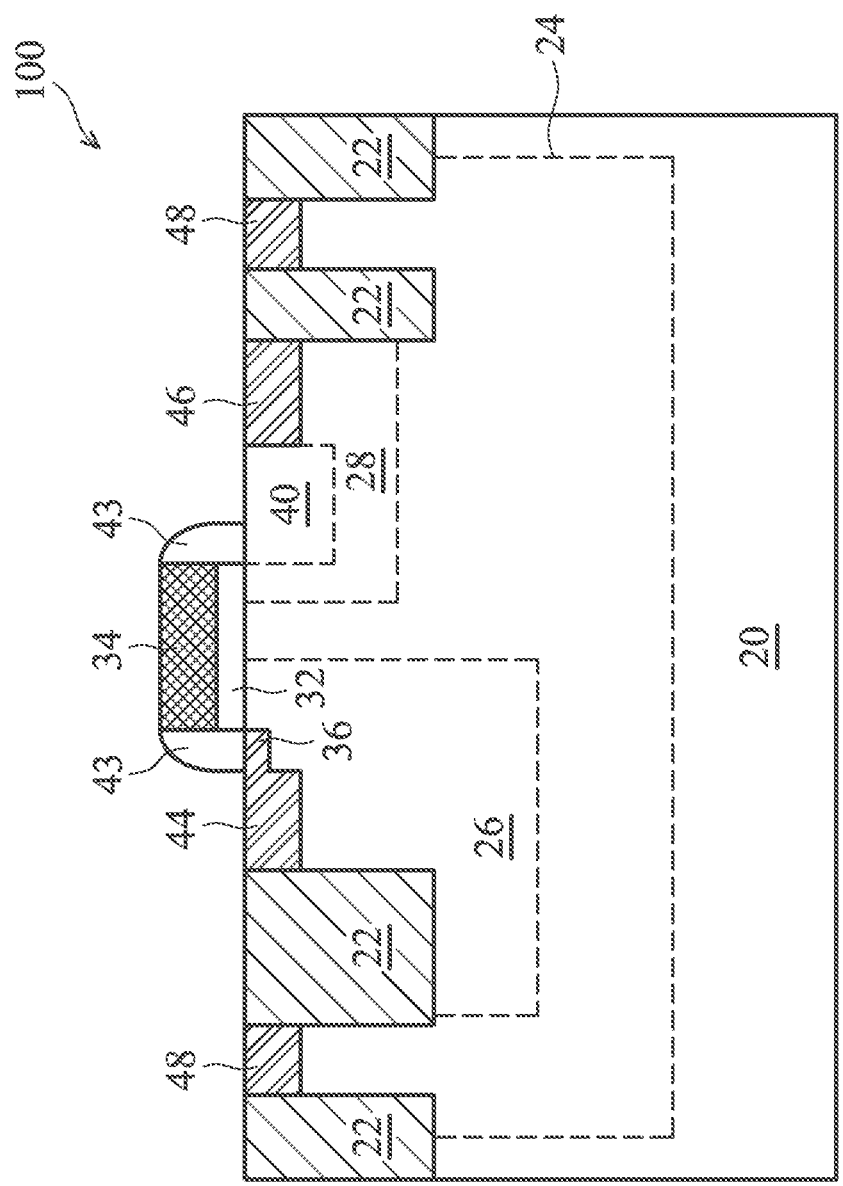

FIG. 4 illustrates the formation of gate spacers 43, source region 44, drain region 46, and n-well pickup regions 48. MOSFET 100 is thus formed. Gate spacers 43 may be formed by depositing a dielectric layer(s), and then patterning the dielectric layers to remove the horizontal portions, while the vertical portions of the dielectric layers on the sidewalls of gate structure 30 are left to from gate spacers 43. The formation process of each of source region 44 and drain region 46 may include forming a photo resist (not shown), and then performing an implantation to form source region 44 and drain region 46 in substrate 20. The impurity concentration of source region 44 and drain region 46 may be greater than about $10^{19}/cm^3$, and may be between about $10^{19}/cm^3$ and about $10^{21}/cm^3$. Drain region 46 is spaced apart from gate structure 30 by nLDD region 40. Accordingly, the respective MOSFET 100 may sustain a high drain voltage. FIG. 4 further illustrates the formation of n-well pickup regions 48 for DNW 24. N-well pickup regions 48 are also formed by implantation.

Figure 5A:
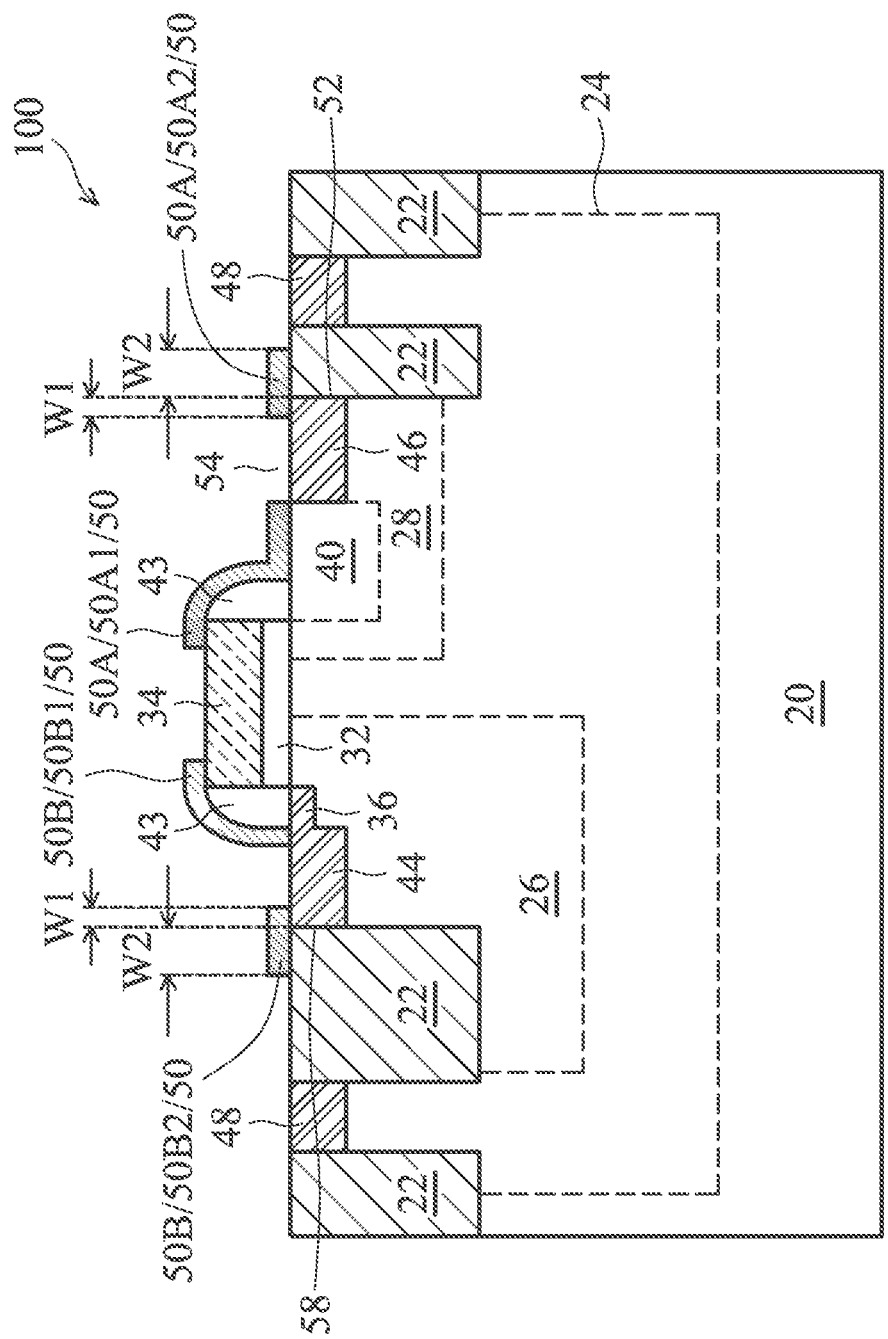
Figure 5B:
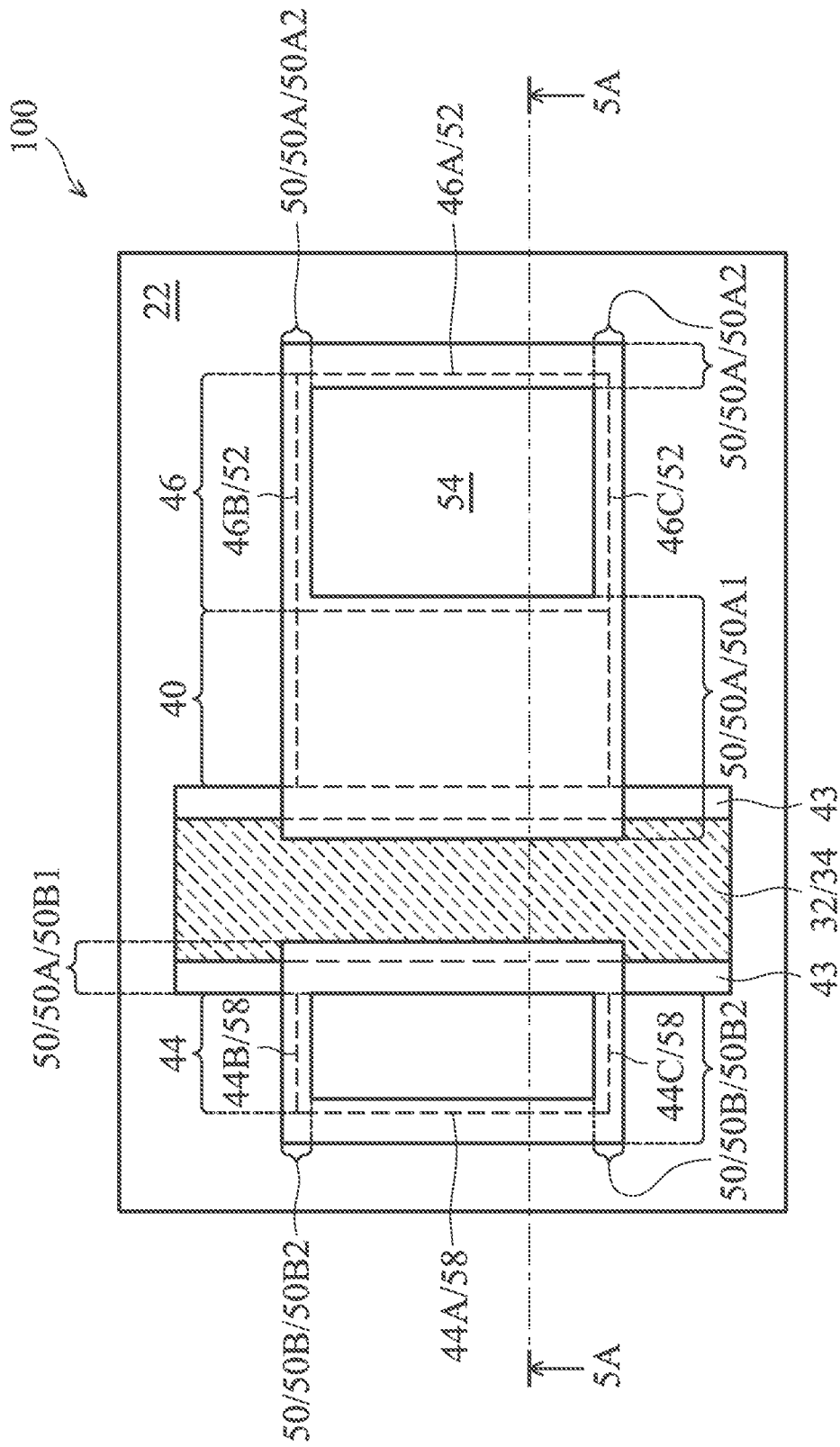
Figure 5C:
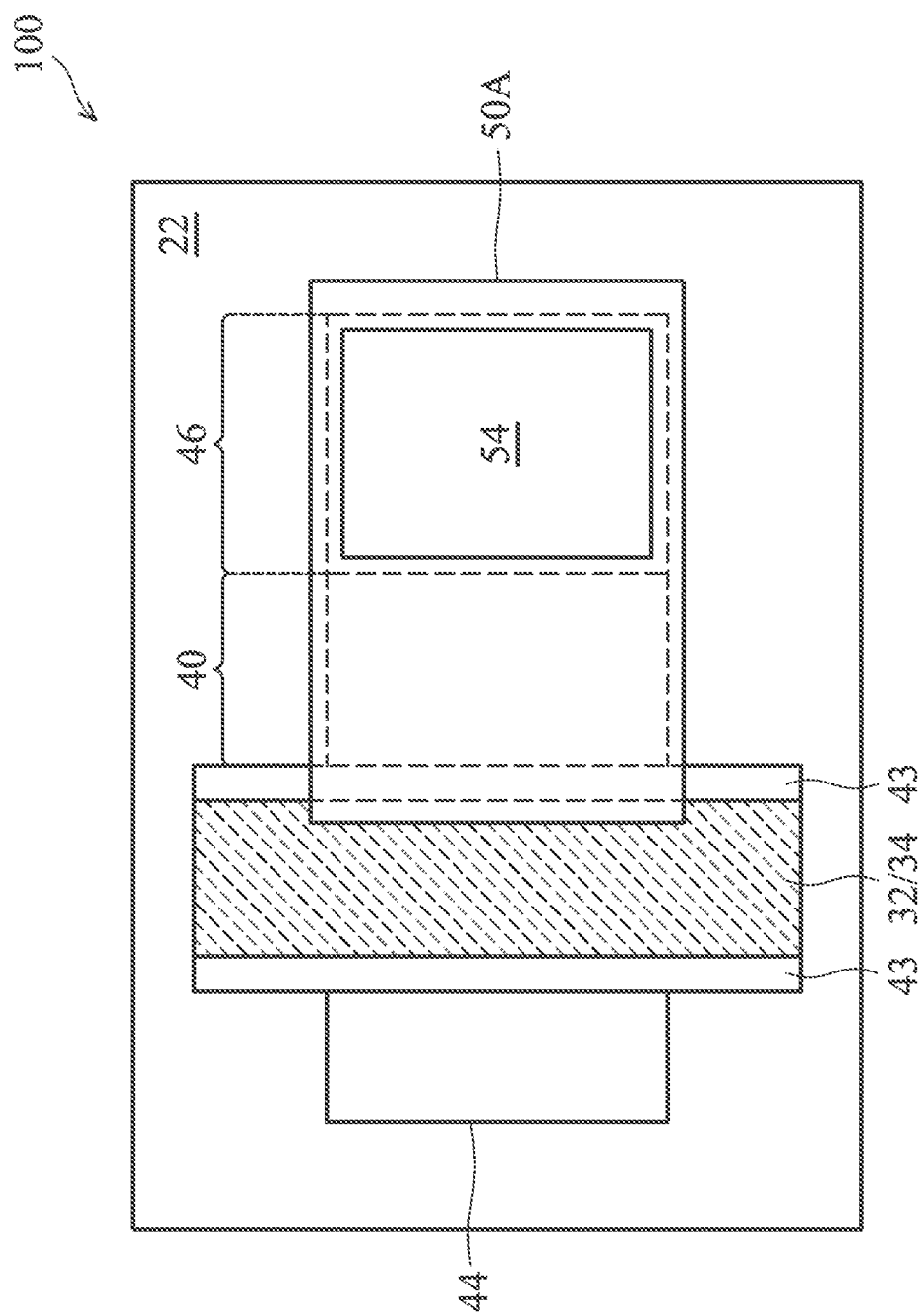

FIGS. 5A through 5C illustrate the formation of dielectric mask 50, which is alternatively referred to as a Resist Protective Oxide (RPO). Referring to FIG. 5A, dielectric mask 50 is formed and patterned. Dielectric mask 50 may include silicon oxide or other types of dielectric materials including, and not limited to, silicon carbide, silicon nitride, high-k dielectric materials, combinations thereof, and multi-layers thereof. Dielectric mask 50 may or may not include portion 50A that is on the drain side of gate structure 30. Dielectric mask portion 50A may or may not include portion 50A1 over and aligned to nLDD region 40 in order to prevent silicide to be formed on nLDD region 40. Dielectric mask portion 50A1 may also extend on the sidewall of gate spacer 43, and possibly over gate structure 30. Dielectric mask 50 may also include portion 50A2 over and aligned to interface 52, which is the interface between the edges of drain region 46 and the edges of the adjoining STI region 22. At least a center portion of drain region 46 is exposed through opening 54 in dielectric mask 50.

Dielectric mask portion 50A2 overlaps a portion of drain region 46, with overlapping width W1 being greater than about 200 nm, for example. Dielectric mask portion 50A2 further overlaps STI region 22, with overlapping width W2 being greater than about 100 nm, for example. Width W1 and W2 may also be smaller than about 100 nm. Dielectric mask portion 50A2 also covers any divot that may occur at interface 52, which divot is the recess in drain region 46 and/or STI region 22 at interface 52.

In some embodiments, on the source side, dielectric mask 50 includes dielectric mask portion 50B (including 50B1 and 50B2) that covers the interfaces 58 between the edges of source region 44 and the edges of the adjoining portion of STI region 22. Similarly, dielectric mask portion 50B2 overlaps a portion of source region 44 and an adjoining portion of STI region 22, with overlapping widths being W1 and W2, respectively. Dielectric mask portion 50B also covers any divot that may occur at interface 58, which divot is the recess in source region 44 and/or STI region 22 at interface 58. Dielectric mask portion 50B may or may not include a portion 501 extending on the top surface of gate structure 30 and on the sidewall of gate spacer 43. In alternative embodiments, dielectric mask 50 does not include any portion that overlaps interface 58.

FIG. 5B illustrates an exemplary top view of the structure shown in FIG. 5A, wherein the cross-sectional view in FIG. 5A is obtained from the plane crossing line 5A-5A in FIG. 5B. As shown in FIG. 5B, substantially an entirety of nLDD region 40 is covered by dielectric mask portion 50A1. Dielectric mask portions 50A1 and 50A2 may be joined with each other to form a continuous region. Dielectric mask portions 50A2 may cover some or all interfaces 52 formed between drain region 46 and STI region 22. For example, in some embodiments, drain region 46 includes edge 46A that is substantially parallel to the lengthwise direction of gate structure 30, and edges 46B and 46C that are perpendicular to edge 46A. Edges 46B and 46C also connect to the edges of nLDD region 40. Accordingly, dielectric mask portion 50A2 also includes three strips, each covering one of edges 46A, 46B, and 46C, which also form interfaces 52 with the adjoining STI regions 22. Dielectric mask portion 50A may form a ring, with a center portion of drain region 46 exposed through opening 54 in the ring. The side of the ring close to gate structure 30 may be wider than the side of the ring away from gate structure 30.

Similarly, dielectric mask portion 50B, if formed, may also include a portion parallel to the lengthwise direction of gate structure 30 and covering edge 44A of source region 44. Dielectric mask portion 50B may also include portions perpendicular to the lengthwise direction of gate structure 30 and covering edges 44B and 44C of source region 44. FIG. 5C illustrates a top view of an embodiment similar to the embodiment in FIGS. 5A and 5B, except that dielectric mask portion 50B is not formed. Dielectric mask portion 50A, however, is still formed on the drain side of MOSFET 100.

Figure 6A:
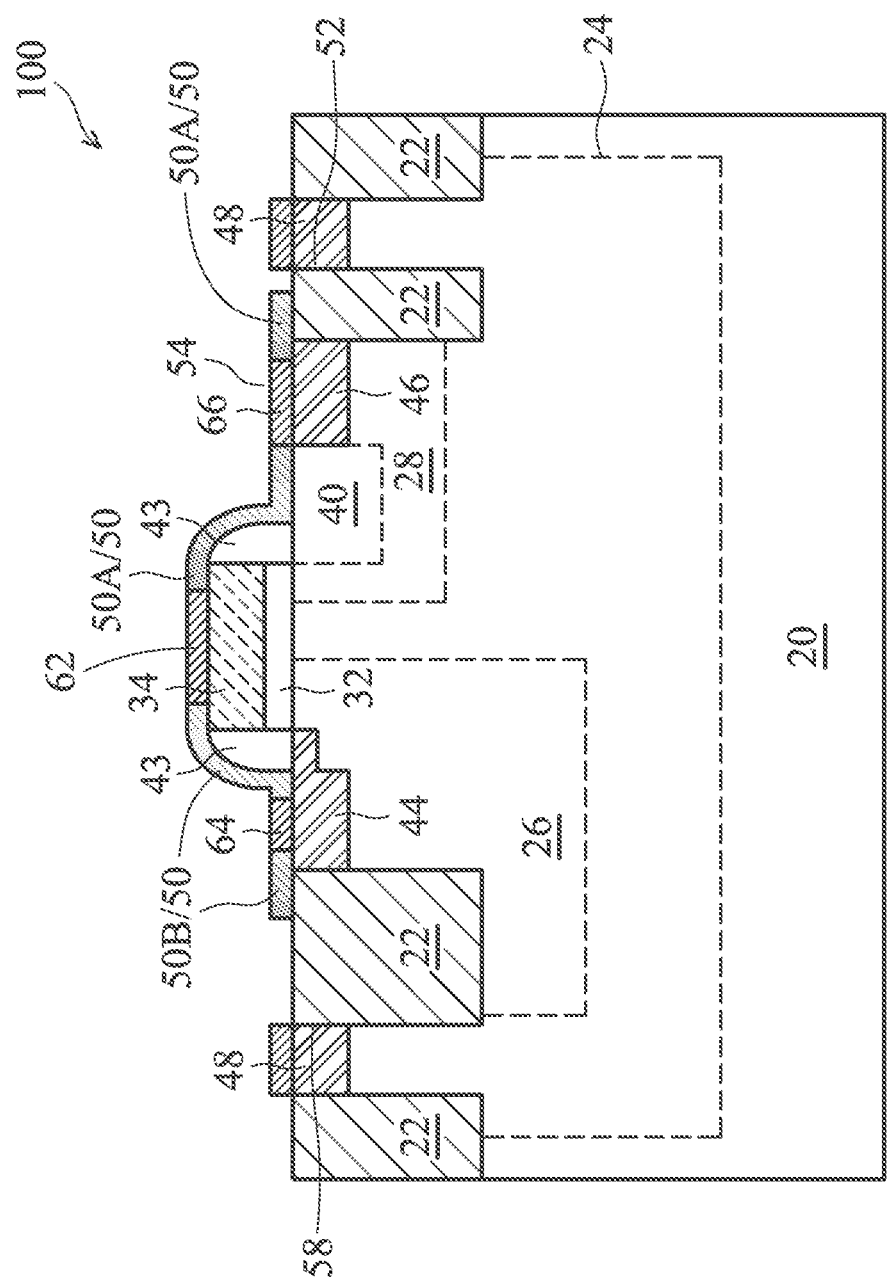

FIG. 6A illustrates the formation of gate silicide region 62, source silicide region 64, and drain silicide region 66. In some embodiments, the formation of silicide regions 62/64/66 may include a self-aligned silicide (salicide) process. The silicide process include blanket depositing a metal layer (not shown) on the structure shown in FIGS. 5A/5B or FIG. 5C, followed by an anneal to cause the reaction between the metal layer and the underlying silicon. Silicide regions 62, 64, and 66 are thus formed. The metal layer may include nickel, cobalt, titanium, platinum, or the like. The unreacted portion of the metal layer is then removed. Due to the masking of dielectric mask 50, the resulting drain silicide region 66 is formed in opening 54 in dielectric mask portion 50A. Silicide region 66 does not extend to interface 52 between drain region 46 and STI region 22. Similarly, source silicide region 64 is formed in the opening in dielectric mask portion 50B, and does not extend to interface 58, which is between source region 44 and STI region 22.

Figure 6B:
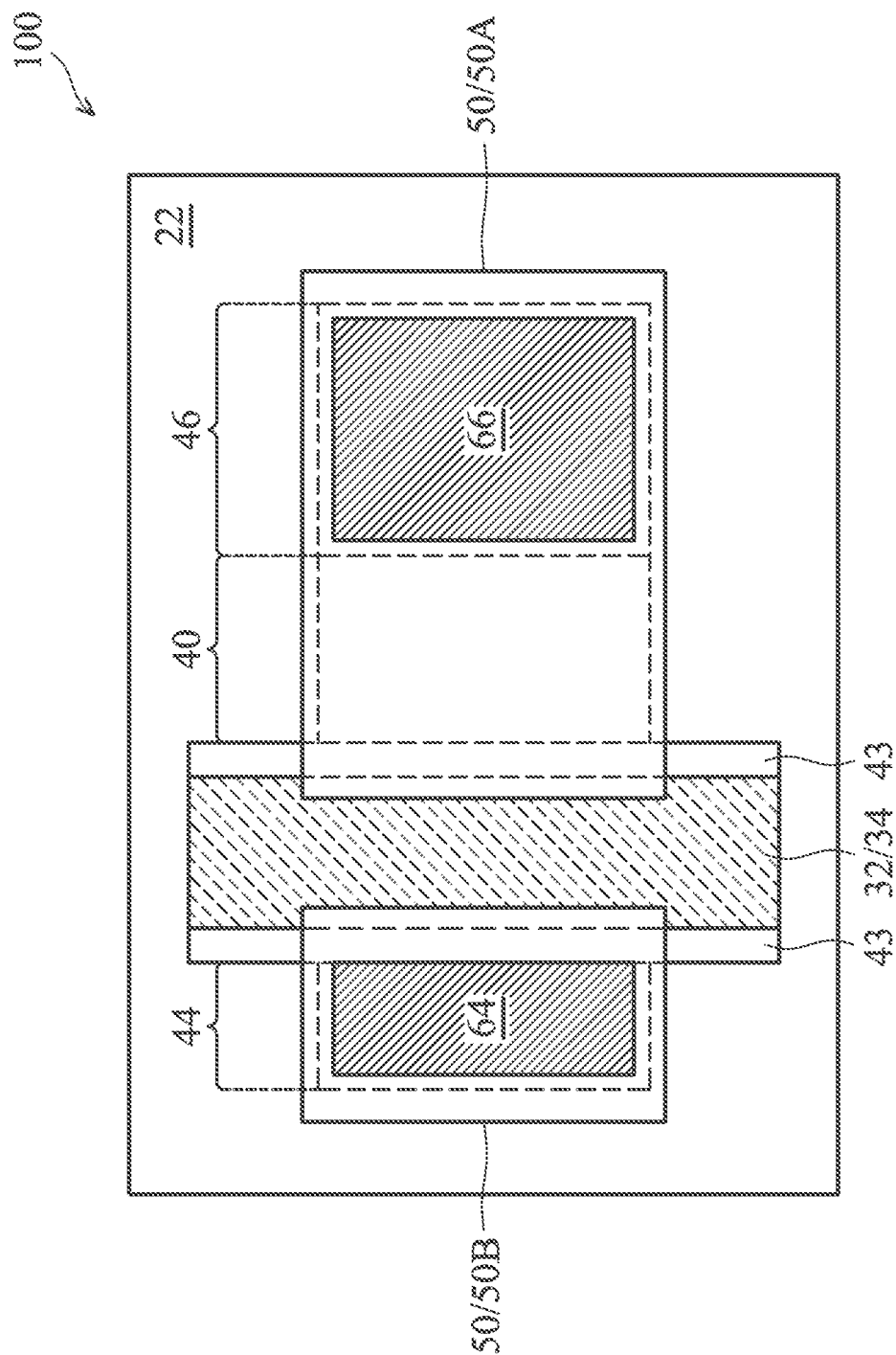

FIG. 6B illustrates a top view of the structure shown in FIG. 6A. It is observed that the formation of silicide regions 62/64/66 is self-aligned to the openings in dielectric mask 50. The edges of the source silicide region 64 and drain silicide region 66 are aligned to the inner edges of the dielectric mask rings that are formed of dielectric mask portions 50B and 50A, respectively.

Figure 7:
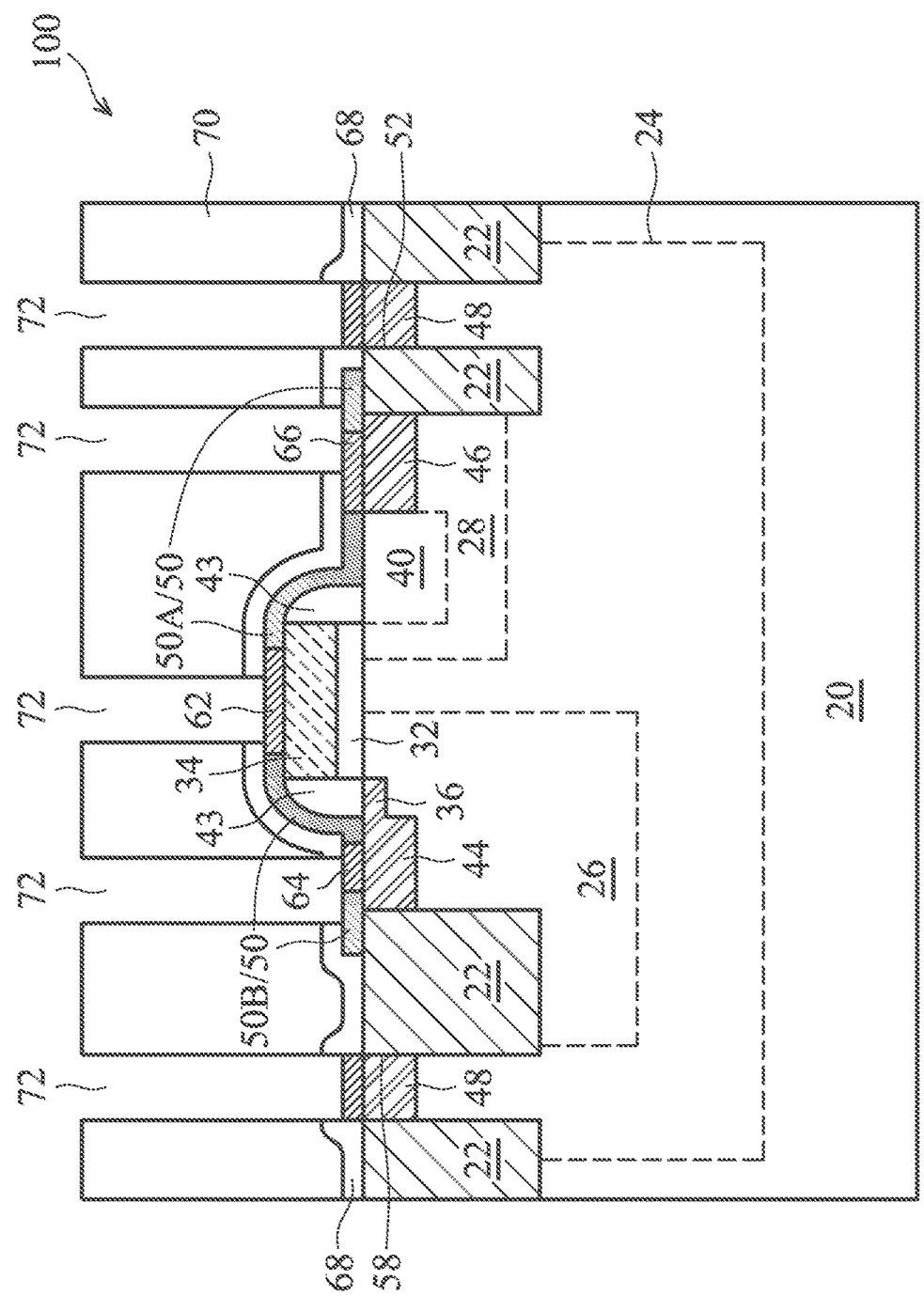

FIG. 7 illustrates the formation of an insulating dielectric layer 68, such as a Contact Etch Stop Layer (CESL). Insulating dielectric layer covers, and are in contact with, silicide regions 62, 64, and 66 and dielectric mask 50. Insulating dielectric layer 68 may be formed of dielectric materials such as silicon oxide, silicon nitride, or combinations thereof. Furthermore, the material of insulating dielectric layer 68 is selected to be different from that of dielectric mask 50, so that in the etching of insulating dielectric layer 68 and the overlying Inter-Layer Dielectric (ILD) 70 for forming contact openings 72, there is a high etching selectivity between insulating dielectric layer 68 and dielectric mask 50.

Following the formation of insulating dielectric layer 68, ILD 70 is formed. Contact openings 72 are then formed in ILD 70 and insulating dielectric layer 68, so that silicide regions 62, 64, and 66 are exposed through contact openings 72. In the formation of contact openings 72, ILD 70 is first etched, with insulating dielectric layer 68 acting as the etch stop layer. After the etch stops on insulating dielectric layer 68, the exposed portions of insulating dielectric layer 68 in openings 72 are etched. The etch of insulating dielectric layer 68 stops on silicide regions 62/64/66. In the situation (as illustrated) that contact openings 72 are misaligned with the respective silicide regions 64 and 66, dielectric mask 50 is exposed in contact openings 72. Accordingly, in the etch of insulating dielectric layer 68, dielectric mask 50 acts as the etch stop layer, and may be substantially un-etched, or at least have a lower portion left after the etch of insulating dielectric layer 68 is finished. Accordingly, interfaces 52 between drain region 46 and STI region 22 are protected by dielectric mask portion 50A. In the embodiments wherein dielectric mask 50B is formed on the source side, interfaces 58 between source region 44 and STI region 22 are protected by dielectric mask portion 50B.

Figure 8:
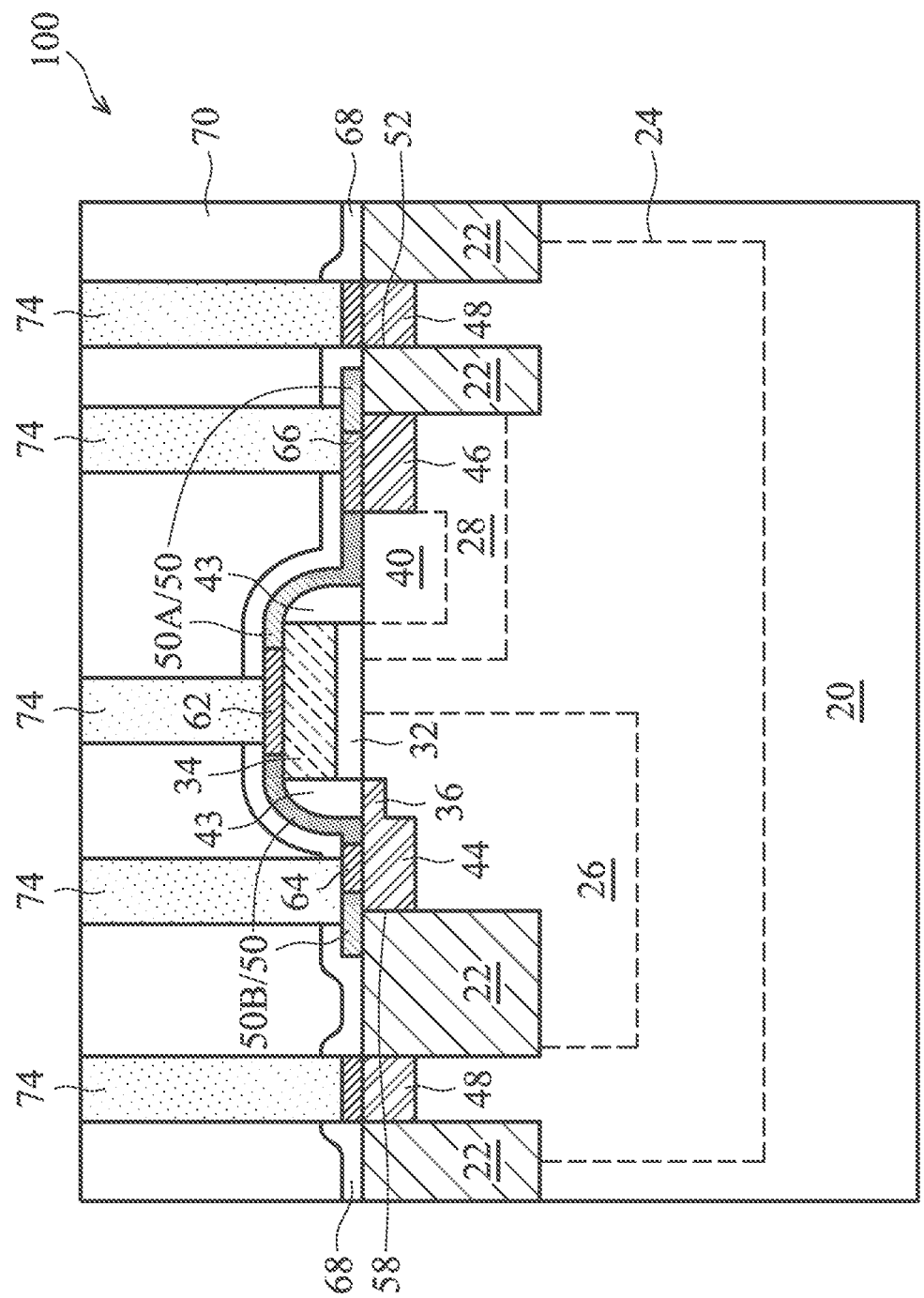

FIG. 8 illustrates the formation of contact plugs 74 in contact openings 72. In some embodiments, contact plugs 74 comprise tungsten. The formation process may include filling a conductive material, such as tungsten, into openings 72, and then preforming a Chemical Mechanical Polish (CMP) to remove excess portions of the conductive material from over ILD 70. The remaining portions of the conductive material form contact plugs 74.

It is appreciated that although the illustrated embodiments show a high voltage MOSFET, dielectric mask 50 may also be formed to cover the interfaces of the source/drain regions and the STI regions in other types of devices including, and not limited to, low voltage MOSFETs such as logic MOSFETs, memory MOSFETs, and the like. In the illustrated embodiments, p-type MOSFETs are provided to explain the concept of the embodiments. It is also appreciated that the teaching in the embodiments is readily applicable on the formation of n-type MOSFETs, with the conductivity types of the respective doped regions inverted from that of p-type MOSFETs.

Figure 9:
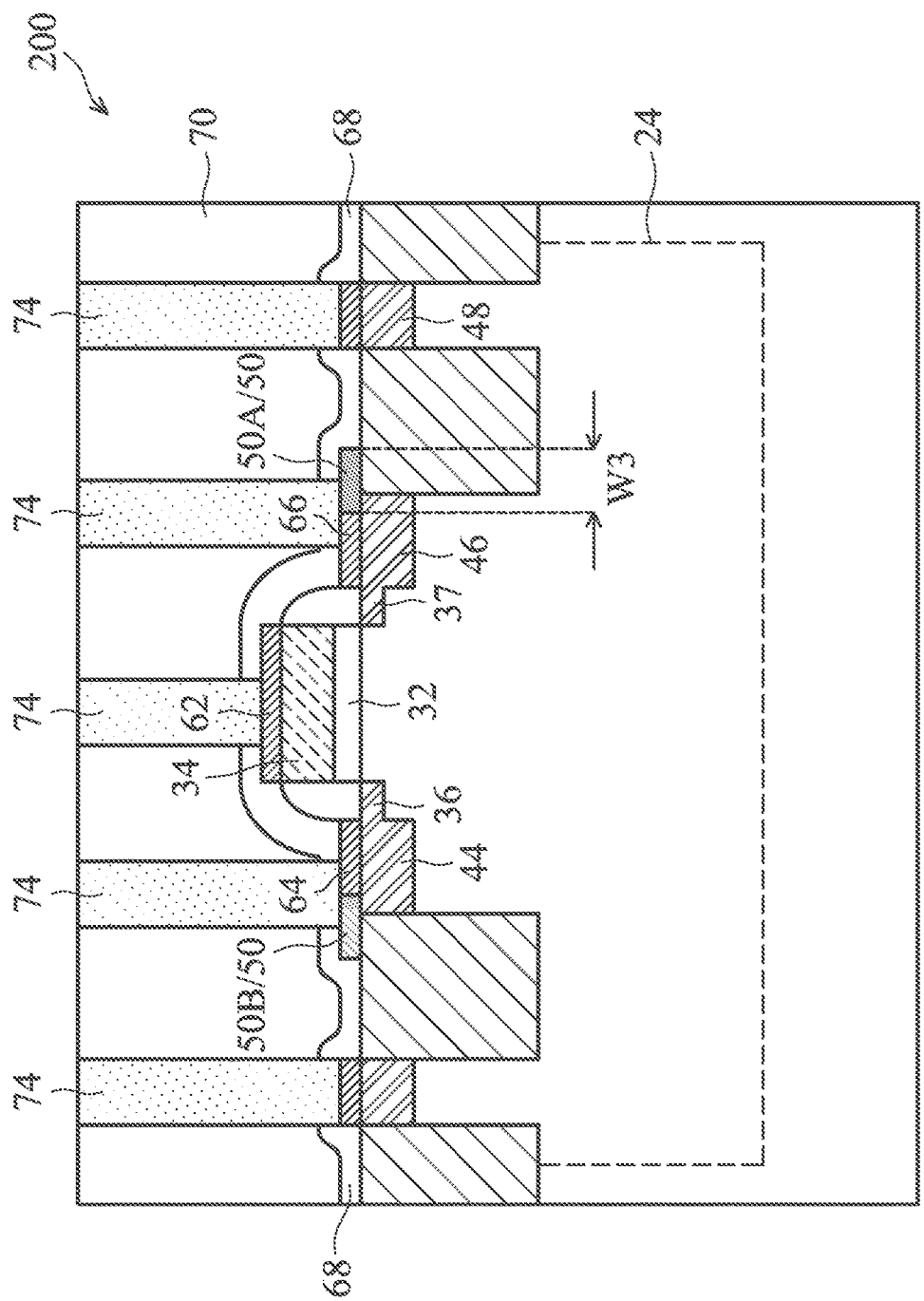
FIG. 9 illustrates a cross-sectional view of a MOSFET in accordance with alternative embodiments.

Furthermore, the MOSFET in accordance with embodiments may have different structures than illustrated in FIGS. 1 through 8. For example, FIG. 9 illustrates MOSFET 200, which includes source extension region 36 and drain extension region 37, whose edges are substantially aligned to the edges of gate electrode 34. N-well 26 and p-well region 28 are not formed in these embodiments. MOSFET 200 may have a drain operation voltage at around 5 volts, for example. Dielectric mask portion 50B, which is on the source side, may be formed or may be omitted. Width W3 of dielectric mask portions 50A and/or 50B in accordance with embodiments may be between about 0.1 μm and about 0.8 μm in accordance with some embodiments.

The formation of dielectric mask 50 may prevent the leakage to the source/drain junctions. For example, if a divot is formed at the interface 52 between drain region 46 and the adjoining STI region 22, dielectric mask 50 at least partially fills the divot, and further prevents contact plug 74 from extending into the divot. The leakage caused by the undesirable formation of the divot is thus eliminated.

In accordance with embodiments, a device includes a substrate, a gate dielectric over the substrate, and a gate electrode over the gate dielectric. A drain region and a source region are disposed on opposite sides of the gate electrode. Insulation regions are disposed in the substrate, wherein edges of the insulation regions are in contact with edges of the drain region and the source region. A dielectric mask includes a portion overlapping a first interface between the drain region and an adjoining portion of the insulation regions. A drain silicide region is disposed over the drain region, wherein an edge of the silicide region is substantially aligned to an edge of the portion of the dielectric mask.

In accordance with other embodiments, a device includes a substrate, a gate dielectric over the substrate, a gate electrode over the gate dielectric, and a gate spacer on a sidewall of the gate electrode. A drain region and a source region are disposed on opposite sides of the gate electrode. Insulation regions are disposed in the substrate, wherein edges of the insulation regions are in contact with edges of the drain region to form a first interface parallel to a lengthwise direction of the gate electrode, and a second and a third interfaces perpendicular to, and adjoining, the first interface. A dielectric mask has a first, a second, and a third portion overlapping the first, the second, and the third interfaces, respectively, and may has a fourth portion on a sidewall of the gate spacer. A drain silicide region is over the drain region, wherein the drain silicide is encircled by the dielectric mask.

In accordance with yet other embodiments, a method includes forming insulation regions in a semiconductor substrate, forming a gate structure comprising a gate dielectric and a gate electrode over the semiconductor substrate, and forming a source region and a drain region on opposite sides of the gate structure. A dielectric mask is formed, wherein the dielectric mask includes a portion overlapping an interface between the drain region and the semiconductor substrate. A portion of the drain region is exposed through an opening in the dielectric mask. A drain silicide region is formed over the exposed portion of the drain region. An insulating dielectric layer is formed over the drain silicide region and the dielectric mask.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a gate structure overlying a substrate;
   a first source/drain region and a second source/drain region on opposing sides of the gate structure;
   a first isolation region adjacent the first source/drain region; a second isolation region adjacent the second source/drain region;
   a first dielectric layer extending over a portion of the first source/drain region and the first isolation region;
   a second dielectric layer over the first dielectric layer;
   a contact plug extending through the second dielectric layer; and
   a silicide region interposed between the contact plug and the first source/drain region, the silicide region extending between the second dielectric layer and the first source/drain region, wherein
   an upper surface of the first source/drain region immediately adjacent the first isolation region is free of the silicide region; wherein
   the first insulating layer completely surrounds the silicide region in a plan view.

2. The device of claim 1, wherein an upper surface of the second dielectric layer is non-planar.

3. The device of claim 2, further comprising a third dielectric layer over the second dielectric layer, the third dielectric layer having a planar upper surface.

4. The device of claim 1, wherein the first dielectric layer extends over an interface between the second source/drain region and the second isolation region.

5. The device of claim 1, further comprising a P-well, wherein the P-well abuts a bottom surface of the first source/drain region.

6. The device of claim 5, wherein the first isolation region extends lower than a bottom surface of the P-well.

7. The device of claim 5, further comprising an N-well, wherein the N-well abuts a bottom surface of the second source/drain region.

8. The device of claim 7, wherein the N-well abuts a bottom surface of the second isolation region.

9. A device comprising:
   a gate structure overlying a substrate; a first source/drain region adjacent the gate structure; a first isolation region adjacent the first source/drain region;
   a first dielectric layer extending over a portion of the first source/drain region and the first isolation region, the first dielectric layer extending over an interface between the first source/drain region and the first isolation region;
   a silicide region on a first portion of an upper surface of the first source/drain region, a second portion of the upper surface of the first source/drain region being free of the silicide region, the second portion of the upper surface of the first source/drain region being interposed between the silicide region and the first isolation region in a plan view;
   a second dielectric layer over the first dielectric layer and over the silicide region; and a contact plug extending through the second dielectric layer to the silicide region; wherein
   the first insulating layer completely surrounds the silicide region in a plan view.

10. The device of claim 9, wherein the first dielectric layer is conformal.

11. The device of claim 10, wherein the second dielectric layer is conformal.

12. The device of claim 9, wherein a distance between an edge of the silicide region and an edge of the first dielectric layer over the first isolation region is between about 0.1 μm and about 0.8 μm.

13. The device of claim 9, further comprising an LDD region interposed between the gate structure and the first source/drain region, wherein the LDD region extends further into a substrate than the first source/drain region.

14. The device of claim 9, wherein the first source/drain region is a drain.

15. The device of claim 9, wherein the contact plug contacts an upper surface of the first dielectric layer.

16. A device comprising:
    a semiconductor substrate;
    a gate dielectric over the semiconductor substrate; a gate electrode over the gate dielectric; a source/drain region in the semiconductor substrate;
    a Shallow Trench Isolation (STI) region in the semiconductor substrate, wherein the source/drain region abuts the STI region;
    a first insulating layer over a portion of the source/drain region and a portion of the STI region, wherein a portion of the source/drain region closest to the STI region is covered by the first insulating layer;
    a silicide region over and contacting the source/drain region, wherein the silicide region does not extend between the first insulating layer and the source/drain region to the STI region;
    a second insulating layer over and physically contacting respective top surfaces of the first insulating layer and the silicide region; and
    a contact plug extending through the second insulating layer; wherein
    the first insulating layer completely surrounds the silicide region in a plan view.

17. The device of claim 16, wherein the contact plug overlaps an interface between the silicide region and the first insulating layer.

18. The device of claim 16, further comprising a lightly doped drain region, wherein the first insulating layer extends over lightly doped drain region.

19. The device of claim 16, wherein at least a portion of the STI region is free of the first insulating layer.

* * * * *